United States Patent [19]
Mitchell

[11] 3,889,205
[45] June 10, 1975

[54] TEMPERATURE COMPENSATED ACOUSTIC SURFACE WAVE OSCILLATOR

[75] Inventor: Richard Frank Mitchell, Kingston, England

[73] Assignee: U.S. Philips Corporation, New York, N.Y.

[22] Filed: Apr. 8, 1974

[21] Appl. No.: 458,833

[30] Foreign Application Priority Data

Apr. 9, 1973 United Kingdom .............. 16917/73

[52] U.S. Cl. ............... 331/41; 331/107 A; 331/176
[51] Int. Cl. ......................... H03b 3/04; H03b 21/00
[58] Field of Search ........ 331/107 A, 37, 40, 41–43, 331/176

[56] References Cited

UNITED STATES PATENTS

| | | | |
|---|---|---|---|
| 2,859,346 | 11/1958 | Firestone et al. | 331/37 |
| 3,582,540 | 6/1971 | Adler et al. | 331/107 A X |
| 3,766,496 | 10/1973 | Whitehouse | 331/107 A |

*Primary Examiner*—Siegfried H. Grimm
*Attorney, Agent, or Firm*—Frank R. Trifari; Bernard Franzblau

[57] ABSTRACT

A temperature compensated acoustic surface wave oscillator includes an acoustic surface wave propagating substrate having two pairs of interdigital transducers disposed thereon. Each pair of transducers includes a positive feedback loop with an amplifier interconnecting the launching and receiving transducers of each pair to maintain first and second oscillations of different frequencies related to the respective temperature coefficients of oscillation frequency to maintain a zero temperature coefficient of an output oscillation. The output oscillation is derived as the sum or difference frequency of a mixer circuit that receives the oscillations from each feedback loop. The acoustic surface wave propagation directions of the two pairs of transducers are different and are selected so that the temperature coefficients of frequency of the respective first and second oscillations are substantially constant.

9 Claims, 1 Drawing Figure

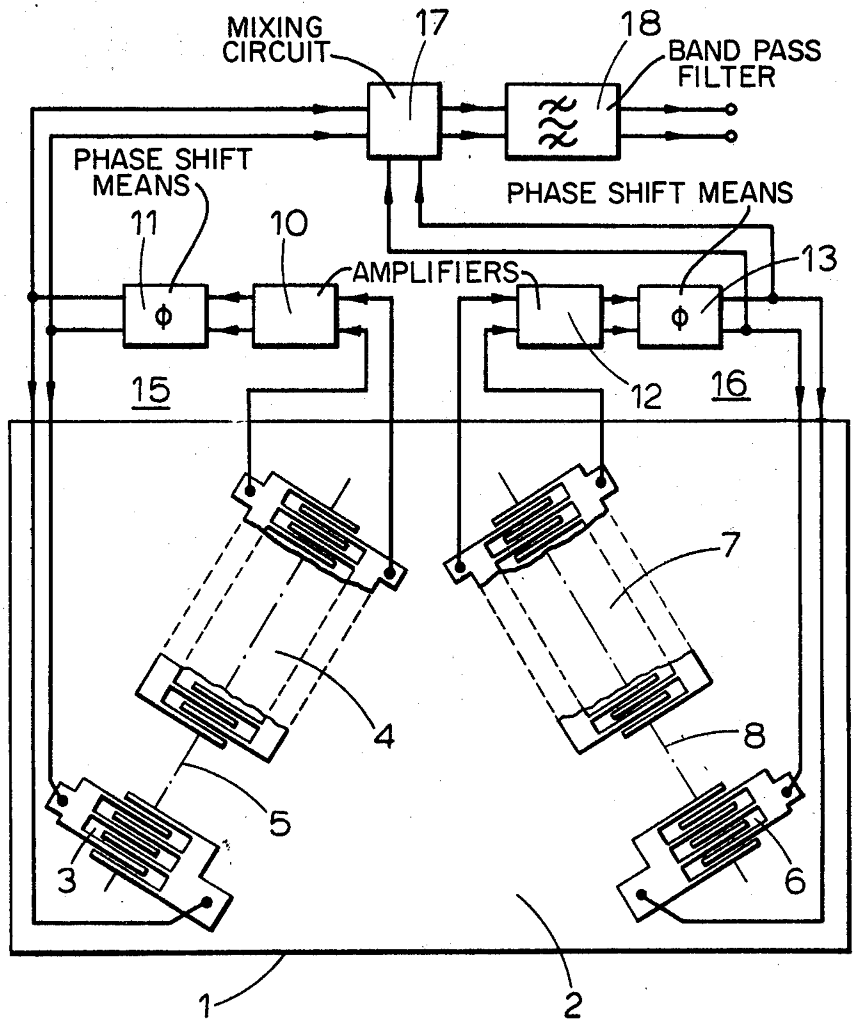
MIXING CIRCUIT
17
18
BAND PASS FILTER
PHASE SHIFT MEANS
11
10
AMPLIFIERS
PHASE SHIFT MEANS
13
12
15
16
7
4
8
5
3
6
1
2

TEMPERATURE COMPENSATED ACOUSTIC SURFACE WAVE OSCILLATOR

THE INVENTION relates to improvements in or relating to acoustic surface wave oscillators.

The use of acoustic surface waves such for example as Rayleigh waves, has enabled devices requiring time delay or frequency selective functions to be manufactured in a form which is small and robust, and moreover can be manufactured by techniques similar to those employed in the manufacture of integrated circuits. Acoustic surface wave devices make it possible to avoid the difficulties associated with discrete inductors, such as the bulk and the manufacturing cost associated therewith.

An acoustic surface wave is normally launched on the planar surface of a piezoelectric body by a launching transducer comprising an interdigital electrode applied to the planar surface. A similar interdigital electrode located in the acoustic surface wave propagation path from the launching transducer enables the received acoustic surface wave to be reconverted into an electrical signal after a time delay which depends on the distance separating the centres of the respective launching and receiving electrodes, and inversely on the velocity of propagation of the acoustic surface wave in the propagation direction.

An oscillator can be formed by amplifying the output from the receiving transducer and feeding the resultant signal back to the launching transducer. A slight delay will be introduced by the amplifier but this will generally be small compared with the acoustic surface wave propagation delay. The oscillator can in theory oscillate in any of the modes whose frequency is denoted by $^1/n\tau$ where n is any integer and $\tau$ is the total delay round the oscillation loop. In order to restrict the oscillation to a single desired frequency use can be made of the frequency selective properties of the periodic structure of the interdigital transducer. Thus the periodicity of the interdigital electrode in respect of an acoustic surface wave propagating along the electrode which results from the relation between the relative spacing of the component strip electrodes forming the interdigital electrode and the corresponding velocity of propagation of the acoustic surface wave, is made to correspond to the desired oscillation frequency. By making either or both the receiving and transmitting transducers relatively long and therefore of high Q, the possibility of oscillation at other undesired frequencies can be effectively eliminated. Further filtering means can be included in the amplification loop either in addition or as an alternative to achieve this effect.

The temperature stability of the oscillation frequency of such an oscillator will depend principally on the temperature coefficients of the acoustic surface wave propagation velocity and of the expansion of the monocrystalline body in the propagation direction since these parameters together determined the periodicity of the interdigital transducers and the acoustic surface wave propagation delay. Ideally, the resultant temperature coefficient of the oscillation frequency should be zero, however, it is preferable in an acoustic surface wave delay device in which the acoustic surface wave is excited by an interdigital transducer, to employ a propagation medium which is strongly piezoelectric. Many of the more convenient strongly piezoelectric materials, such as for example certain ferroelectric ceramics, do not contain an acoustic surface wave propagation direction for which the resultant temperature coefficient of delay and hence of oscillation frequency is zero. Some piezoelectric substances, such for example as quartz, do exhibit a propagation direction which would give a zero temperature coefficient of oscillation frequency but it is found that the said temperature coefficient varies rapidly with slight changes in the orientation of the propagation direction to the extent that it is not possible when employing normal manufacturing tolerances to obtain a satisfactory yield of sufficiently stable oscillator devices.

It is an object of the invention to provide a temperature compensated acoustic surface wave oscillator which can be readily manufactured by conventional techniques.

According to the invention there is provided an oscillator including a piezoelectric body having an acoustic surface wave propagation surface formed thereon, a first and a second pair of interdigital transducers, each said pair comprising a launching and a receiving transducer, arranged on said acoustic surface wave propagation surface respectively to launch and receive acoustic surface waves in corresponding first and second acoustic surface wave propagation directions over said acoustic surface wave propagation surface, amplifying means connected respectively to amplify the output of the receiving transducer of each said pair and to feed said amplified output to the corresponding said launching transducer to maintain a respective component oscillation in said pair, said first and second acoustic surface wave propagation directions being selected so that the corresponding temperature coefficients of the frequency of the respective component oscillation are of a significantly different non-zero value each of which is substantially constant with respect to normal manufacturing variations in the orientations of said transducers with respect to the crystallographic axes of said body, and output means for deriving an output oscillation whose frequency is either the sum or the difference of said component oscillations, the respective frequencies of said component oscillations being selected in relation to their temperature coefficients of oscillation frequency so that the temperature coefficient of said output oscillation is substantially zero.

An acoustic surface wave propagation direction is to be taken herein to mean a direction in which it is not only possible to propagate an acoustic surface wave but also to launch and receive an acoustic surface wave by means of an interdigital electrode, and an acoustic surface wave propagation surface is to mean a surface containing at least one acoustic surface wave propagation direction as herein defined.

Phase adjustment means can be arranged in the amplification loop associated with at least one of said pairs of interdigital transducers for adjusting the frequency of the output oscillation. The piezoelectric body can be formed of Lithium Niobate.

Alternatively when a piezoelectric substance is employed which displays a rapid variation of temperature coefficient with orientation through a direction of zero temperature coefficient but has directions for which the temperature coefficients are of opposite sign and change only slightly with direction, a zero temperature coefficient of the output oscillation can be provided which is relatively unaffected by manufacturing tolerances, by adding the two component oscillations. This embodiment is suitable for use with Quartz as the propagation medium.

In order that the invention may be clearly understood and readily carried into effect, embodiments thereof will now be described by way of example with reference to the accompanying drawing, the single FIGURE of which illustrates a temperature compensated acoustic surface wave oscillator embodying the invention.

Referring to the drawing, which illustrates diagrammatically a temperature compensated oscillator embodying the invention, a monocrystalline piezoelectric wafer 1 formed of Lithium Niobate is arranged so that the upper surface 2 thereof forms an acoustic surface wave propagation surface as herein defined. Two pairs of interdigital transducers are formed on the surface 2, one pair comprising a launching transducer 3 and a receiving transducer 4 arranged to direct and receive a beam of acoustic surface waves along a direction indicated by the line 5, and the other pair comprising a launching transducer 6 and a receiving transducer 7 arranged to direct and receive a beam of acoustic surface waves along a direction indicated by the line 8.

The output signal from the receiving transducer 4 is fed to the input of an amplifier 10 the output of which is fed via adjustable phase shifting means 11 to the input connections of the launching transducer 3 in order to maintain oscillations in the loop 15 so formed. In a similar manner the output from the receiving transducer 7 is amplified by an amplifier 12 and fed to the launching transducer 6 via adjustable phase shifting means 13 to maintain oscillations in the corresponding loop 16. An output is also taken from each of the phase shifters 11 and 13 and fed to a mixing circuit 17 in which the oscillations in the two loops are mixed together and the difference frequency is selected from the output of the mixer by means of a band-pass filter 18 which can be an acoustic surface wave filter.

The frequency of oscillation in the loops 15 and 16 is determined by the total delay $\tau$ round the loop and could in general occur arbitrarily at any one of the frequencies $1/\tau$, $1/2\tau$, . . . . $1/n\tau$ . . . where the loop gain is greater than unity unless the respective loop is arranged so that the overall loop gain is greater at one selected frequency than at any other possible frequency. In selecting a respective desired oscillation frequency in each loop, use is made of the frequency determining properties of the transducers 3, 4, 6 and 7. Thus in the oscillation loop 15, the frequency of oscillation is selected from those frequencies which are possible as a result of the loop delay $\tau$ by making one of the transducers, in the present example the receiving transducer 4, relatively long and with a uniform interdigital electrode spacing corresponding to the selected frequency. The overall length of the interdigital electrode system of the transducer 4 is made equal to the centre to centre spacing of the transducers 3 and 4, and this causes the amplitude response of the transducer 4, while exhibiting a maximum at the selected frequency, to exhibit minima at each of the other possible frequencies. The launching transducer 3 is also made with a periodicity corresponding to the selected frequency but can be shorter in length than the transducer 4. The phase adjustment means 11 is included to enable the oscillation frequency to be adjusted. The frequency of oscillation of the loop 16 is similarly determined by the form, periodicity and relative location of the transducers 6 and 7, and can be similarly adjusted by the phase adjustment means 13 if desired. It should be noted that any suitable alternative method of filtering can be employed to enhance the loop gain at the selected frequency to a sufficient extent relative to the loop gain at other possible oscillation frequencies to ensure oscillation only at the selected frequency in either of the respective oscillation loops 15 and 16.

The wafer 1 of lithium niobate is cut from a monocrystal with an orientation to the crystallographic axes such that two directions 5 and 8 can be found on the acoustic surface wave propagation surface for which the corresponding temperature coefficients of the loop oscillation frequency are of a significantly different non-zero value and each of which is substantially constant with respect to normal manufacturing variations in the orientation of the transducers 3, 4, 6, and 7 with respect to the crystallographic axes of the monocrystal during fabrication of the device. Thus in the case of a normal anisotropic crystal like Lithium Niobate, the temperature coefficient of the oscillation frequency will vary between a maximum and a minimum value, both positive, as the acoustic surface wave propagation direction is rotated about an axis normal to the propagation surface. Since the said temperature coefficient will vary least with respect to a given angular displacement of the propagation direction at both the maximum and the minimum value orientations, these directions are chosen for the directions 5 and 8.

Taking the frequency of oscillation in the oscillation loops 15 and 16 as $f_1$ and $f_2$ respectively at a temperature $T_1$, and the temperature coefficients of the oscillation frequencies in the directions 5 and 8 to be $a$ and $b$ respectively, then at a temperature of $T_1 + \Delta T$ the frequency of the loop 15 will be $f_1 (1+a \Delta T)$ and the frequency of the other loop will be $f_2 (1+b \Delta T)$. The output frequency of the device will be:-

$$f_1 (1+a\Delta T) - f_2 (1+b \Delta T) = f_1 - f_2 + (f_1 a - f_2 b)\Delta T$$

Thus the condition that this output frequency is the same at $T_1+\Delta T$ as at the temperature $T_1$, namely $(f_1-f_2)$, is:

$$f_2 = a/b\, f_1$$

Thus from the desired output frequency and the ratio of the temperature coefficients in the directions 5 and 8, the design frequencies $f_1$ and $f_2$ for the component oscillators and corresponding transducers can readily be calculated.

In an alternative embodiment in which quartz is employed to form the monocrystalline piezoelectric body 1, the sum frequency is derived from the circuit 17 by the output filter 18. Quartz is a crystalline substance for which in general an acoustic surface wave propagation surface will have a propagation direction for which the said temperature coefficient is positive and a maximum and another direction for which the said temperature coefficient is negative and also a maximum. Between these directions is a direction for which the temperature coefficient passes through zero but at the same time changes rapidly with a change in direction. The propagation directions 5 and 8 are each chosen to coincide with a corresponding direction of maximum temperature coefficient for which the coefficient is relatively insensitive to small angular deviations. The frequencies $f_1$ and $f_2$ are chosen in a similar manner as before, since in this case, although the two frequencies are added, one temperature coefficient is negative and the condition for a zero change in the output frequency is that:

$$f_2 = a/b\, f_1$$

I claim:

1. An oscillator comprising a piezoelectric body having an acoustic surface wave propagation surface formed thereon, a first and a second pair of interdigital transducers, each said pair comprising a launching and a receiving transducer arranged on said acoustic surface wave propagation surface respectively to launch and receive acoustic surface waves in corresponding first and second acoustic surface wave propagation directions over said acoustic surface wave propagation surface, amplifying means connected respectively to amplify the output of the receiving transducer of each said transducer pair and to feed said amplified output to the corresponding said launching transducer to maintain a respective component oscillation in said pair, said first and second acoustic surface wave propagation directions being selected so that the corresponding temperature coefficients of the frequency of the respective component oscillation are of a significantly different non-zero value each of which is substantially constant with respect to normal manufacturing variations in the orientations of said transducers with respect to the crystallographic axes of said body, and output means for deriving an output oscillation whose frequency is either the sum or the difference of said component oscillations, the respective frequencies of said component oscillations being selected in relation to their temperature coefficients of oscillation frequency so that the temperature coefficient of said output oscillation is substantially zero.

2. An oscillator as claimed in claim 1, in which the amplification loop associated with at least one of said pairs of interdigital transducers includes phase adjustment means for adjusting the frequency of the output oscillation.

3. An oscillator as claimed in claim 1 in which said piezoelectric body is formed of lithium niobate.

4. An oscillator as claimed in claim 1, in which said piezoelectric body is formed of quartz.

5. A temperature compensated oscillator comprising, a crystal acoustic surface wave propagation substrate, a first pair of interdigital transducers comprising an input transducer and an output transducer disposed on said substrate to transmit and receive acoustic surface waves of a first frequency along a first propagation direction, a second pair of interdigital transducers comprising a second input transducer and a second output transducer disposed on said substrate to transmit and receive acoustic surface waves of a second frequency along a second different propagation direction, amplifier means connected to form first and second positive feedback loops between the output and input transducers of said first and second pairs of transducers, respectively, to maintain oscillations at said first and second frequencies, respectively, said first and second propagation directions being chosen so that the corresponding temperature coefficients of said first and second oscillation frequencies are substantially constant with respect to the crystal axes of the substrate, and mixing means coupled to the output of the amplifier means for deriving an output oscillation signal of the sum or difference frequency between said first and second oscillation frequencies, said first and second pairs of transducers and said substrate being chosen so that the first and second oscillation frequencies in relation to their respective temperature coefficients of oscillation frequency maintain the temperature coefficient of the output oscillation signal substantially zero.

6. A temperature compensated amplifier as claimed in claim 5 wherein the length of the interdigital electrode system of one transducer of said first pair of transducers is equal to the center-to-center spacing between the input and output transducers of said first pair of transducers.

7. A temperature compensated amplifier as claimed in claim 5 wherein said substrate is composed of lithium niobate and said mixing means derives an output oscillation signal that is the difference frequency of said first and second oscillation frequencies.

8. A temperature compensated amplifier as claimed in claim 4 wherein said substrate is composed of quartz and said mixing means derives an output oscillation signal that is the sum frequency of said first and second oscillation frequencies.

9. A temperature compensated amplifier as claimed in claim 5 wherein said amplifier means includes adjustable phase shift means for adjusting the frequency of the output oscillation signal.

* * * * *